United States Patent [19]

Phillips et al.

[11] Patent Number: 4,894,018

[45] Date of Patent: Jan. 16, 1990

[54] LOW PROFILE ELECTRICAL CONNECTOR

[75] Inventors: Kevin P. Phillips, Chagrin Falls; William R. Stein, Sr., Warren, both of Ohio

[73] Assignee: General Motors Corporation, Detroit, Mich.

[21] Appl. No.: 229,872

[22] Filed: Aug. 8, 1988

[51] Int. Cl.$^4$ .............................................. H01R 9/09
[52] U.S. Cl. .......................................... 439/81; 439/78
[58] Field of Search ...................... 439/78, 79, 80, 81, 439/82, 43, 55, 34, 56, 419, 547, 554, 76; 174/68.5

[56] References Cited

U.S. PATENT DOCUMENTS

| | | | |
|---|---|---|---|
| 1,781,537 | 11/1930 | Caruso | 105/49 |
| 1,794,831 | 3/1931 | Caruso | 29/831 |
| 2,399,753 | 5/1946 | McLarn | 219/56.1 |
| 2,757,319 | 7/1956 | Kapp | 174/68.5 X |
| 2,825,038 | 2/1958 | Woofter | 174/68.5 |
| 2,938,939 | 5/1960 | Malcolm | 174/68.5 |
| 3,275,736 | 9/1966 | Hotine et al. | 174/84 R |
| 4,024,627 | 5/1977 | Stauffer | 439/84 X |
| 4,223,435 | 9/1980 | Roberts | 29/83 |
| 4,295,184 | 10/1981 | Roberts | 361/406 |

OTHER PUBLICATIONS

Design News, pp. 110, 111 dated May 4, 1987, Catalog p. 35 undated.

Primary Examiner—Neil Abrams
Assistant Examiner—Khiem Nguyen
Attorney, Agent, or Firm—F. J. Fodale

[57] ABSTRACT

An electrical connector comprises a relatively rigid circuit board of thermoplastic material, a support plate of the same material and a plurality of metallic bus strips disposed in channels of the circuit board. Each of the bus strips has a flanged female terminal portion comprising a pair of cantilevered contact fingers which engage pin terminals inserted in pin holes of the support plate. Each bus strip has a perpendicular male terminal portion at the opposite end which is disposed in an integral connector body of the circuit board.

10 Claims, 4 Drawing Sheets

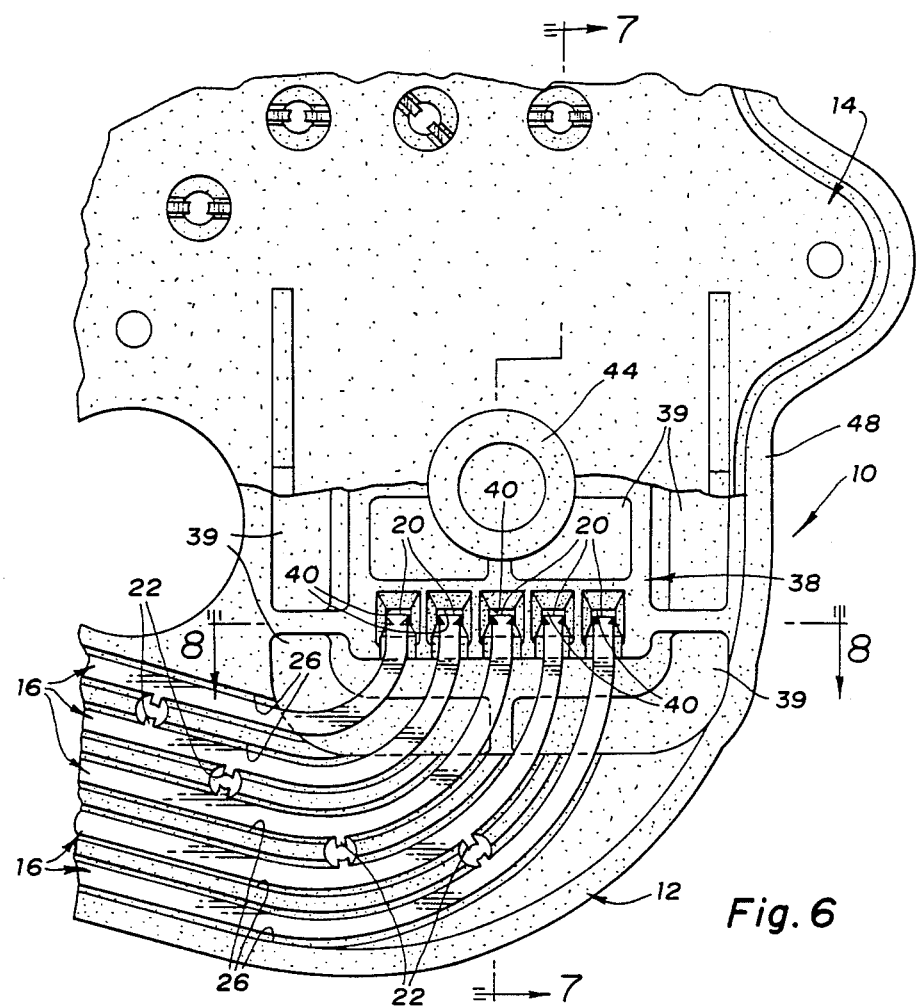

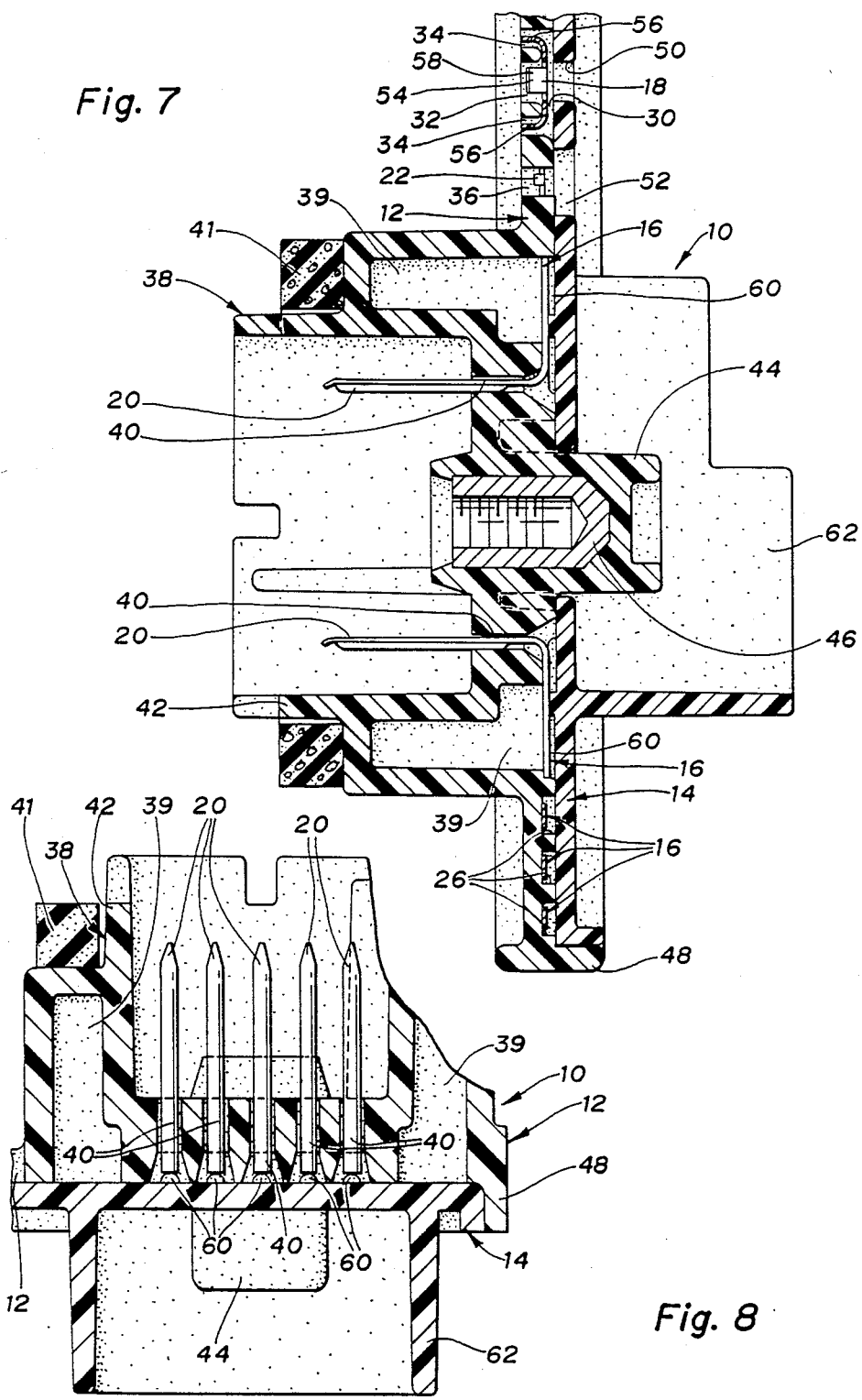

LOW PROFILE ELECTRICAL CONNECTOR

BACKGROUND OF THE INVENTION

This invention relates generally to electrical connectors and more specifically to an electrical connector for connecting a wiring harness to an array of widely dispersed pin terminals such as the pin terminals of multiple electromagnetic solenoids in an electronically controlled automotive transmission.

Such transmissions may have as many as five electromatic solenoids and ten electrical terminals, usually pin terminals, to energize the solenoids. In the past, this widely dispersed array of pin terminals were electrically connected to individual conductor wires which had mating terminals at one end and second terminals at the other end which were loaded into a connector body. This connector body in turn mated with a connector body of the automotive wiring harness.

SUMMARY OF THE INVENTION

The object of this invention is to provide an electrical connector for making an electrical connection between a widely dispersed array of pin terminals and a connector body which is considerably simpler and less expensive to manufacture and assemble than the prior method of using individual conductor wires and connectors.

A feature of the invention is that electrical connector comprises a relatively rigid circuit board and support plate which are easy to handle and assemble to the widely dispersed array of pin terminals on the one hand and to the wiring harness on the other hand.

Another feature of the invention is that the several individual conductors are provided by relatively rigid bussing assemblies which are easy to handle, assembly and convert into several individual bussing strips which provide the conductors needed for connecting the pin terminals to the wiring harness.

Another feature of the invention is that individual bussing strips have female terminal portions which float to engage the pin terminals better.

Another feature of the invention is that the electrical connector has a low force resisting engagement while at the same time the electrical connector has a high force resisting disengagement.

Still another feature of the invention is that the bussing strips have bow resistant female terminal portions to maintain normal forces acting on the pin terminals.

Still yet another feature of the invention is that the electrical connector includes an integral connector body for connecting the electrical connector to a mating connector body of a wiring harness or the like and provision for holding terminal portions of the bussing strips in the integral connector body.

Other objects and features of the invention will become apparent to those skilled in the art as disclosure is made in the following detailed description of a preferred embodiment of the invention which sets forth the best mode of the invention contemplated by the inventors and which is illustrated in the accompanying sheet(s) of drawing.

BRIEF DESCRIPTION OF THE DRAWINGS

FIG. 5 is a section taken substantially along the line 5—5 of FIG. 3 looking in the direction of the arrows.

FIG. 6 is an enlarged view of the lower right hand portion of the electrical connector which is shown in FIG. 1 after the electrical connector is completed.

FIG. 7 is a section taken substantially along the line 7—7 of FIG. 6 looking in the direction of the arrows.

FIG. 8 is a section taken substantially along the line 8—8 of FIG. 6 looking in the direction of the arrows.

DETAILED DESCRIPTION OF THE PREFERRED EMBODIMENT

Figure 1:
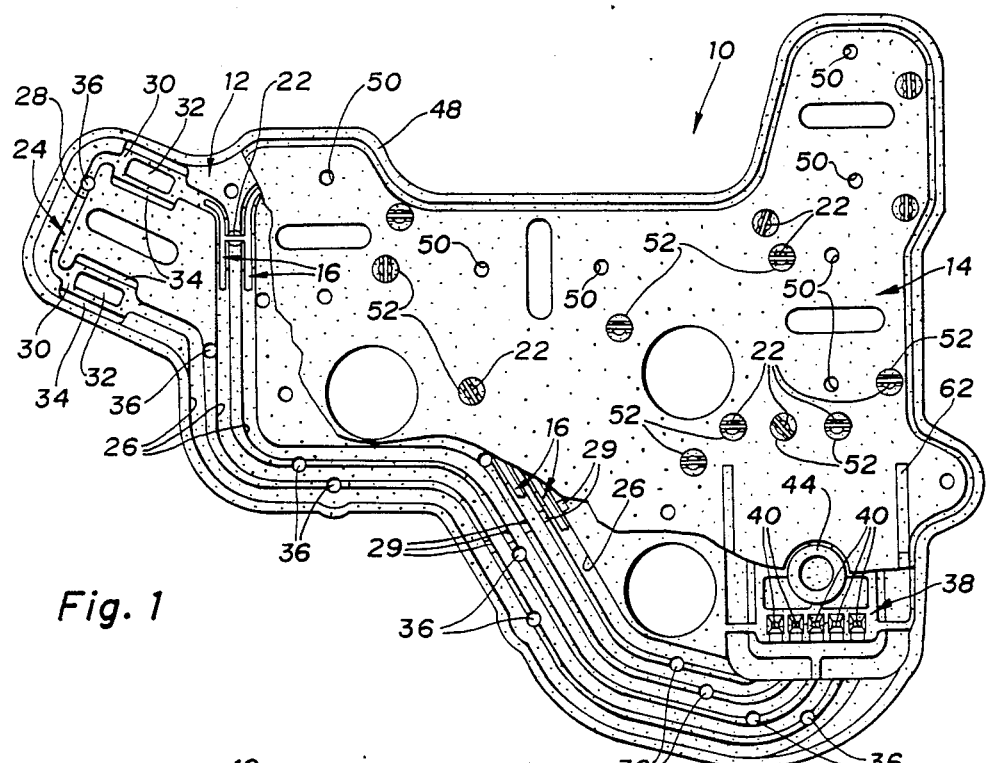
FIG. 1 is a plan view of a partially manufactured electrical connector in accordance with the invention.

Referring now to the drawing the electrical connector 10 in accordance with this invention comprises a circuit board 12 of relative rigid thermoplastic material such as nylon, a support plate 14 of the same material and a plurality of metallic bus strips 16. Each of the bus strips 16 has a female terminal portion 18 at one end and a bent up male terminal portion 20 at the other end. The bus strips 16 which are preferably made of a spring tempered, tin plated, brass are connected by several bridges 22 to form one or more bussing subassemblies to facilitate handling during manufacture.

In the particular example of this disclosure, ten bus strips 16 are connected by bridging portions 22 to form two relatively stiff stamped subassemblies each comprising five bus strips 16 connected by several bridges 22.

The circuit board 12 has two channel networks 24 for receiving the two subassemblies. These channel networks 24 include main channels 26 which receive the bus strips 16 and bridging channels 28 which connect the main channels 26 and receive the bridges 22 of the stamped bussing subassemblies.

The main channels 26 include co-planar female terminal cavities 30 which receive the female terminal portions 18. Each female terminal cavity 30 communicates with a rectangular opening 32 and a pair of side slots 34 of the circuit board 12 as shown in FIGS. 2, 3, 4 and 5. The circuit board 12 also has punch holes 36 which communicate with the bridging channels 28 as shown in FIGS. 1, 2, 3, 6 and 7. The circuit board 12 also includes fences 29 which help guiding the bus strips 16 into the main channels 26 and keeping them in the main channels until the support plate 14 is attached. The support plate 14 has a slot not shown) which receives the top ends of the fences 29 when the support plate 14 is attached to the circuit board 12.

The circuit board 12 further includes an integral connector body 38 which is isolated by a deep internal channel 39 in moat-like fashion as shown in FIGS. 1, 6, 7 and 8. The other side of the moat serves as a shelf to accommodate a sealing gasket 41. The connector body 38 has two sets of male terminal cavities 40 associated with the respective channel networks 24. The male terminal cavities 40 communicate with the respective main channels 26 to receive the perpendicularly disposed male terminal portions 20 of the bus strips 16.

The connector body 38 has an external shroud 42 for receiving a mating connector body (not shown) such as would be attached to the end of a wiring harness (not shown). The male terminal portions 20 protrude into the shroud 40 as shown in FIGS. 7 and 8. The male terminal portions 20 are ribbed longitudinally to increase the effective thickness and stiffness of the male terminal portions 20.

The connector body 38 also includes a central attachment cup 44 which carries a threaded brass sleeve 46. The mating connector body carries a bolt (not shown) for clamping the mating connector bodies together.

Figure 3:
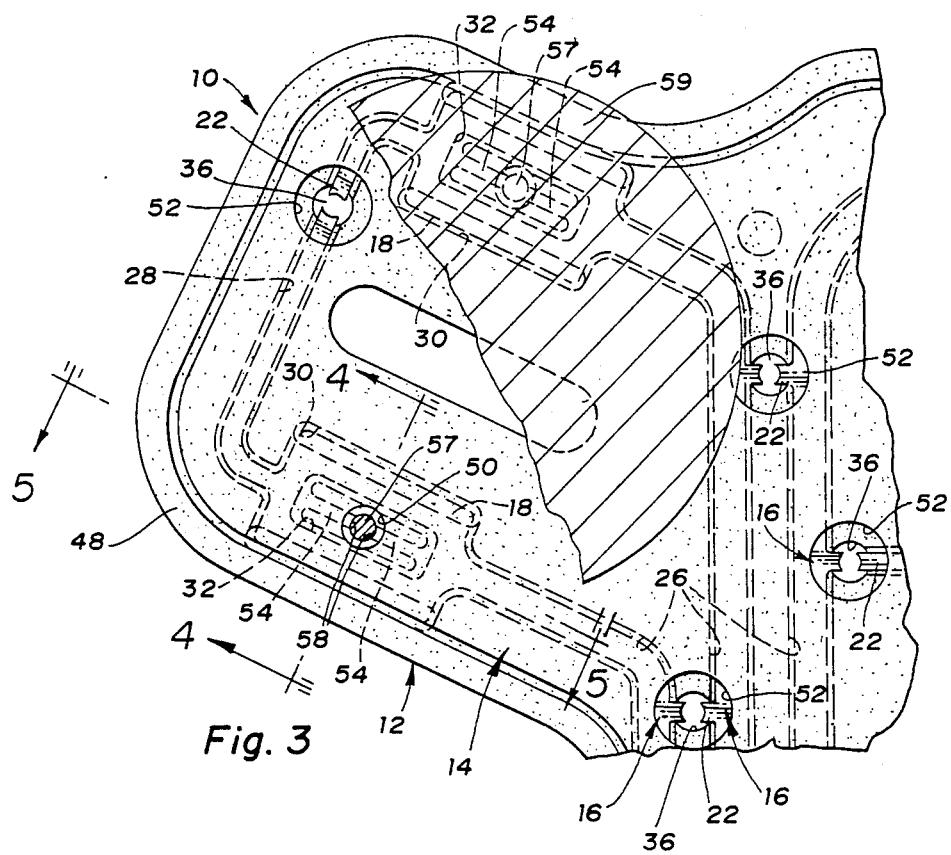
FIG. 3 is an enlarged view similar to FIG. 2 showing the completed electrical connector attached to a solenoid.

The support plate 14 which is nested in an outer rim 48 of the circuit board 12 has an array of pin holes 50 and an array of enlarged punch holes 52. The pin holes 50 communicate with the respective female terminal cavities 30 which in turn communicate with the rectangular openings 32 of the circuit board 12 as best shown in FIGS. 3, 4, 5 and 7. The enlarged punch holes 52 on the other hand, communicate with the bridging channels 28 and the punch holes 36 of the circuit board 12 as best shown in FIGS. 1, 3 and 7.

The electrical connector 10 is assembled by inserting the stamped bussing assemblies comprising the bus strips 16 and bridges 22 into the channel networks 24 of the circuit board 12 as shown in FIG. 1. The stamped bussing assemblies are relatively stiff and easy to handle due to the several bridges 22. It should be noted that the channels 26 and 28 of the channel networks 24 are wider than the corresponding portions of the bussing assemblies so that the individual bus strips 16 float laterally in the main channels 26 after the bridges 22 are severed as shown in FIGS. 3 and 7.

Figure 2:
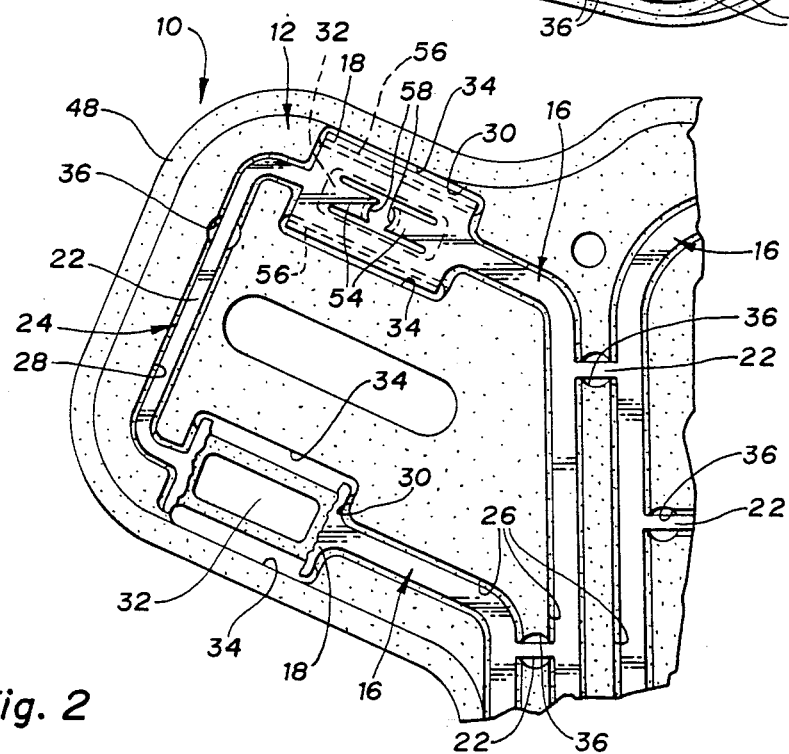
FIG. 2 is an enlarged view of the left end portion of the electrical connector which is shown in FIG. 1.
Figure 4:
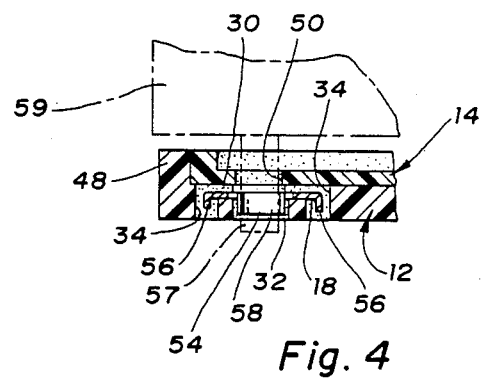
FIG. 4 is a section taken substantially along the line 4—4 of FIG. 3 looking in the direction of the arrows.

The female terminal cavities 30 are also wider than the paddle shaped female terminal portions 18 for the same purpose that is to allow lateral float. The female terminal portions 18 each include a pair of cantilevered contact fingers 54 and side flanges 56. The cantilevered contact fingers 54 are disposed over the rectangular openings 32 of the circuit board 12 as best shown in FIGS. 2 and 5. The contact fingers 54 have perpendicularly disposed ends 58 which are circular in cross section. These perpendicular ends 58 are aligned with the pin holes 50 of the support board 14 and extend into the rectangular slots 32 of the circuit board 12 as shown in FIGS. 4, 5 and 7.

Consequently, a pin terminal, such as the pin terminals 57 of the electromagnetic solenoid 59, is easily inserted into the female terminal portion 18 via the pin hole 50 because the contact fingers 54 deflect into the rectangular opening slot 32 during pin insertion. On the other hand, the pull out is resisted with considerable force because the contact fingers 54 are supported by the support board 14 adjacent the pin hole 50 and do not deflect to any appreciable extent when the pin terminal 57 is pulled out via the pin hole 50.

The side flanges 56 resist bowing of the female terminal portion 18 thus maintaining the normal forces of the contact fingers 54 acting on the pin terminal 57. These side flanges 56 are disposed in the side slots 34 which are oversize with respect to the side flanges 56 as shown in FIGS. 2, 4 and 7 so that the side flanges 56 also assist in locating the female terminal portions 18 while permitting the female terminal portions 18 to float laterally in the female terminal cavities 30 enough to adjust for tolerance variations in the locations of the pin terminals 57.

After the stamped bussing assemblies are inserted into the channel networks 24, the support plate 14 is nested in the circuit board 12 as shown in the drawing. The support plate 14 is then secured to the circuit board 12 by ultrasonic welding or other suitable securing means. The several bridges 22 of the stamped bussing assemblies are then severed by punches which have access through the punch holes 36 and 52. When the bridges 22 are severed, the individual bus strips 16 float laterally in the main channels 26 which permits the female contact portions 18 to float and adjust in the oversize female terminal cavities 30 so as to engage pin terminals which are inserted into the pin holes 50 better.

The support plate 14 has comb shaped embossments 60 which engage the bus strips 16 near the perpendicular male terminal portions 20 as shown in FIGS. 7 and 8. These embossments support the male terminal portions 20 in their proper position in the integral connector body 38. The support plate 14 also has an integral guard wall 62 which protects a protruding portion of the attachment cup 44 of the circuit board 12.

We wish it to be understood that we do not desire to be limited to the exact details of construction shown and described, for obvious modifications will occur to a person skilled in the art.

The embodiments of the invention in which an exclusive property or privilege is claimed are defined as follows:

1. An electrical connector comprising:
   a circuit board of relatively rigid thermoplastic material, a support plate of thermoplastic material and a plurality of metallic bus strips disposed in channels of the circuit board which are covered by the support plate,
   each of the bus strips having a female terminal portion disposed in a terminal cavity of its associated channel and a male terminal portion,
   the circuit board having a rectangular opening and a pair of side slots communicating with each of the terminal cavities,
   the support plate having an array of pin holes communicating with the respective terminal cavities and rectangular openings of the circuit board,
   the female terminal portions including cantilevered contact fingers which are disposed over the rectangular openings of the circuit board so that the contact fingers deflect into the rectangular opening whereby pin terminals are easily inserted into the female terminal portions of the bus strips,
   the cantilevered contact fingers having angularly disposed ends which are aligned with the pin holes of the support plate and extend into the rectangular openings of the circuit board to engage pin terminals inserted into the pin holes of the support plate, and
   the female terminal portions having side flanges which are disposed in the side slots to resist bowing of the female terminal portions and assist in locating the female terminal portions with respect to the circuit board.

2. The electrical connector as defined in claim 1 wherein the contact fingers are supported by the support plate adjacent the pin holes to resist pull out of terminal pins from the female terminal portions of the bus strips.

3. The electrical connector as defined in claim 1 wherein the side flanges are disposed in side slots which are oversize with respect to the side flanges and the female terminal portions float laterally in the terminal cavities so that the contact fingers engage terminal pins which are inserted into the pin holes of the support plate better.

4. The electrical connector as defined in claim 1 wherein the circuit board further includes an integral connector body which has terminal cavities which communicate with the respective channels to receive the male terminal portions of the bus strips.

5. The electrical connector as defined in claim 4 wherein the support plate has embossments which engage the bus strips near the male terminal portions to support the male terminal portions in the integral connector body of the thermoplastic circuit board; wherein the connector body has an external shroud for receiving a mating connector body; and wherein the male terminal portions protrude into the shroud.

6. An electrical connector comprising:

a circuit board of relatively rigid thermoplastic material, a support plate of thermoplastic material and a plurality of metallic bus strips disposed in channels of the circuit board which are covered by the support plate, each of the bus strips having a female terminal portion disposed in a coplanar female terminal cavity of its associated channel and a perpendicularly disposed male terminal portion which is disposed in a male terminal cavity of an integral connector body of the circuit board, the circuit board having a rectangular opening communicating with each of the female terminal cavities, the support plate having an array of pin holes communicating with the respective female terminal cavities which in turn communicate with the rectangular openings of the circuit board, the female terminal portions each including a pair of cantilevered contact fingers which are disposed over the rectangular openings of the circuit board so that the contact fingers deflect into the rectangular openings whereby pin terminals are easily inserted into the female terminal portions of the bus strips, the cantilevered contact fingers having angularly disposed ends which are circular in cross section, which are aligned with the pin holes of the support plate and which extend into the rectangular openings of the circuit board to engage pin terminals inserted into the pin holes of the support plate, and the cantilevered contact fingers being supported by the support plate adjacent the pin holes to resist terminal pins being pull out of the female terminal portions of the bus strips.

7. The electrical connector as defined in claim 6 wherein the circuit board has a pair of side slots communicating with each of the terminal cavities and the female terminal portions have side flanges which are disposed in the side slots to resist bowing of the female terminal portions and assist in locating the female terminal portions with respect to the circuit board.

8. The electrical connector as defined in claim 7 wherein the side flanges are disposed in side slots which are oversize with respect to the side flanges and the female terminal portions float laterally in the female terminal cavities to improve the engagement of the contact fingers with terminal pins which are inserted into the pin holes of the support plate.

9. The electrical connector as defined in claim 6 wherein the support plate has embossments which engage the bus strips near the male terminal portions to support the male terminal portions in the integral connector body of the circuit board.

10. An electrical connector comprising:

a circuit board of relatively rigid thermoplastic material, a support plate of thermoplastic material and a plurality of metallic bus strips disposed in channels of the circuit board which are covered by the support plate, each of the bus strips having a female terminal portion disposed in a terminal cavity of its associated channel, the circuit board having a rectangular opening communicating with each of the terminal cavities, the support plate having an array of pin holes communicating with the respective terminal cavities which in turn communicate with the rectangular openings of the circuit board, the female terminal portions including cantilevered contact fingers which are disposed over the rectangular openings of the circuit board so that the cantilevered contact fingers upon engagement deflect into the rectangular openings whereby pin terminals are easily inserted into the female terminal portions of the bus strips, the cantilevered contact fingers having angularly disposed ends which are aligned with the pin holes of the support plate and which extend into the rectangular openings of the circuit board to engage pin terminals inserted into the pin holes of the support plate, and the angularly disposed ends of the cantilevered contact fingers being supported by the support plate adjacent the pin holes to resist pull out of pin terminals from the female terminal portions of the bus strips.

* * * * *

UNITED STATES PATENT AND TRADEMARK OFFICE
CERTIFICATE OF CORRECTION

PATENT NO. : 4,894,018

DATED : January 16, 1990

INVENTOR(S) : Kevin P. Phillips; William L. Stein, Sr.

It is certified that error appears in the above-identified patent and that said Letters Patent is hereby corrected as shown below:

Title page, column 1, [75], change inventor's name "William R. Stein, Sr." to -- William L. Stein, Sr. --.

Signed and Sealed this

Ninth Day of April, 1991

*Attest:*

HARRY F. MANBECK, JR.

*Attesting Officer*   *Commissioner of Patents and Trademarks*